United States Patent [19]

Isshiki et al.

[11] Patent Number: 4,815,082
[45] Date of Patent: Mar. 21, 1989

[54] SEMICONDUCTOR LASER DEVICE

[75] Inventors: Kunihiko Isshiki; Takashi Murakami; Wataru Susaki, all of Itami, Japan

[73] Assignee: Mitsubishi Denki Kabushiki Kaisha, Tokyo, Japan

[21] Appl. No.: 870,327

[22] Filed: Jun. 3, 1986

[30] Foreign Application Priority Data

Jun. 28, 1985 [JP] Japan .................................. 60-143205

[51] Int. Cl.[4] .............................................. H01S 3/19
[52] U.S. Cl. ....................................... 372/45; 372/46; 357/17
[58] Field of Search ................ 372/45, 46, 44; 357/17

[56] References Cited

U.S. PATENT DOCUMENTS

| 4,523,317 | 6/1985 | Botez | 357/17 |
| 4,674,094 | 6/1987 | Murakami | 372/45 |
| 4,768,200 | 8/1988 | Isshiki | 372/46 |

Primary Examiner—William L. Sikes
Assistant Examiner—Xuan Thi Vo
Attorney, Agent, or Firm—Lowe, Price, LeBlanc, Becker & Shur

[57] ABSTRACT

A semiconductor laser device in which the thickness of an active layer is made smaller than or equal to 0.04 μm only in regions near the laser light emitting facets and the active layer in the other inner region is made to have a sufficient thickness not to cause a conspicuous deterioration in quality of the layer, that is, a thickness larger than 0.04 μm.

7 Claims, 5 Drawing Sheets

SEMICONDUCTOR LASER DEVICE

BACKGROUND OF THE INVENTION

1. Field of the Invention

The present invention relates to a structure of a semiconductor laser device capable of operating with high output power and high reliability.

2. Description of the Prior Art

FIG. 1 is a view showing a sectional structure of a conventional semiconductor laser device having an inner stripe structure, disclosed, for example, in Japanese Patent Laid-Open Gazette 1727289/1982. In FIG. 1, a conventional semiconductor laser device comprises a p type GaAs semiconductor substrate 1 on which there are provided a p type AlGaAs semiconductor active layer 4 for lasing, a lower cladding layer 3 of p type AlGaAs and an upper cladding layer 5 of n type AlGaAs, these lower and upper cladding layers 3 and 5 being formed in contact with the lower surface and the upper surface of the p type AlGaAs active layer 4, respectively, and both having a larger forbidden band width (band gap) than that of the active layer 4. Between the p type GaAs semiconductor substrate 1 and the p type AlGaAs lower cladding layer 3, an n type GaAs current blocking layer 2 is formed. In addition, a V-shaped groove 7 for ensuring a stable laser addition in a fundamental transverse mode is formed to extend through the n type GaAs current blocking layer 2. On the n type AlGaAs upper cladding layer 5, a contact layer 6 of n type GaAs is formed. On other surface of the n type GaAs contact layer 6 and on other surface of the p type GaAs semiconductor substrate 1, metal electrodes 8a and 8b are formed, respectively. In the following, an operation of the above described conventional device will be described.

A voltage is applied between the metal electrodes 8a and 8b in the forward direction with respect to the pn junction formed in the interface between the active layer 4 and the upper cladding layer 5. As a result, a forward-flowing current narrowed by the V-shaped groove 7 enters the active layer 4 so that light is emitted. The light is guided through a waveguide originating from a difference of the refractive indices between the active layer 4 and the cladding layers 3 and 5 and an effective refractive index difference in the active layer 4 and the V-shaped groove 7 so that lasing is performed by a resonator formed by both cleaved facets (provided along the direction parallel to the surface of the drawing).

In such a conventional semiconductor laser device mainly comprised of AlGaAs, radiating a light in a short wavelength band, regions near the laser light emitting facets serve as regions for absorbing the laser light based on the surface levels. As a result, the maximum light output power is limited by a catastrophic optical damage (referred to hereinafter as COD) at the light emitting facets, which obstructs high-output operation.

For the purpose of removing such obstruction to high-output operation, a method of increasing the light emitting area to decrease optical density may be considered. Such method is adopted in the above described conventional semiconductor laser device in which the thickness of the active layer 4 is made thinner to enhance infiltration of light from the active layer 4 whereby the light emitting area is increased. However, in the conventional semiconductor laser device where the thickness of the active layer is made thinner, the amount of the laser light contributing to induced emission in the active layer is decreased by the infiltration of light. As a result, the lasing threshold current is increased and as a more serious problem, it is confirmed that the longevity of a semiconductor laser device conspicuously deteriorates if the thickness of the active layer is decreased to a certain value or less.

FIG. 2 is a graph showing a relation between the life characteristics of a conventional semiconductor laser device mainly comprised of $Al_xGa_{1-x}As$ and the thickness of an active layer, which is indicated in Journal of Applied Physics, Vol. 56, pp. 3088 (1984). In FIG. 2, the vertical axis represents a change $\Delta Id$ of driving current in a period after 4 hours to 24 hours in the case of constant light output operation with the conditions of 50° C. - 5 mW/facet. As the change $\Delta Id$ increases, degradation becomes more conspicuous. The horizontal axis represents a lasing wavelength, which corresponds to the thickness of an active layer because the aluminum density (X value) is fixed in this case. If the lasing wavelength is shorter than 742 nm, deterioration in quality becomes conspicuous as can be seem from FIG. 2. The lasing wavelength 742 nm corresponds to the thickness of an active layer of 0.06 $\mu$m. In other words, if the thickness of an active layer becomes smaller than 0.06 $\mu$m, the life characteristics are rapidly deteriorated even in the case of low light output operation of 5 mW. Similar phenomena were recognized in laser devices of other structure.

FIG. 3 is a graph showing a relation between the thickness of an active layer in a channeled substrate planar laser device of an active layer curving type and the percentage of reliable laser devices in each wafer, which is shown in Kazimura et al., Proceedings of Autumn Meeting of Japan Applied Physics Society, 30a-B-8 p. 135 (1982). In FIG. 3, the vertical axis represents the percentage of reliable laser devices in each wafer assuming that the devices where the decreasing rate of the light output power in constant current operation for 24 hours is 10% or less with an initial light output power of 3 mW/facet at 50° C. are regarded as reliable laser devices. The horizontal axis represents the thickness of an active layer. In addition, $X_{ACT}$ and $X_{clad}$ indicate X values of an active layer and a cladding layer of $Al_xGa_{1-x}As$, respectively. As can be seen from FIG. 3, the percentage of reliable laser devices is remarkably lowered in a wafer where the thickness of an active layer is smaller than 0.04 $\mu$m.

FIG. 4 is a graph showing a relation between the thickness of an active layer in a twin-ridge-substrate type laser device and a percentage of degraded laser devices, which is disclosed in Hamada et al., IECE Japan Technical Report, Optical Quantum Electronics Group reference OQE 83-59, P.1, 1983. In FIG. 4, the vertical axis represents a percentage of degraded laser devices in a period from the time when 50 hours have passed to the time when 100 hours have passed after the start of a reliability test, and the horizontal axis represents the thickness of an active layer. As can be seen from FIG. 4, if the thickness of an active layer is smaller than 0.05 $\mu$m, the percentage of degradation tends to increase.

A relation between the thickness of an active layer and the life time in operation in a short wavelength laser device is disclosed in "Highly Reliable GaAlAs Visible-Light-Emitting MCSP Lasers", T. Kazimura et al., Japanese Journal of Applied Physics, Vol. 22 supplement 22-1, pp. 325 to 328, 1983. In this paper, it is verified that the life time in operation is extremely decreased if the thickness of the whole area of an active layer is made smaller than 0.04 μm.

As described above, such a conventional method for obtaining high output power by making thinner the whole area of an active layer involves a problem that the life characteristics are extremely deteriorated if the thickness of an active layer is decreased to 0.04 to 0.06 μm or less.

SUMMARY OF THE INVENTION

An object of the present invention is to provide a semiconductor laser device which can perform an operation with high-output power without deteriorating the life characteristics thereof, by which the above described disadvantages of a conventional device can be dissolved.

In a semiconductor laser device in accordance with the present invention, the thickness of an active layer in regions in the vicinity of the laser light emitting facets is made smaller than or equal to 0.04 μm and the thickness of the active layer in the other inner regions is made to have a sufficient value not to cause conspicuous deterioration in quality, that is, a value larger than 0.04 μm.

In regions in the vicinity of the laser light emitting facets, infiltration of light from the active layer having a decreased thickness is enhanced to lower the light density therein and accordingly, the level at which COD occurs is raised. On the other hand, the active layer having an increased thickness in the inner region serves to prevent deterioration of the lasing characteristics and the life characteristics of the laser device.

These object and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
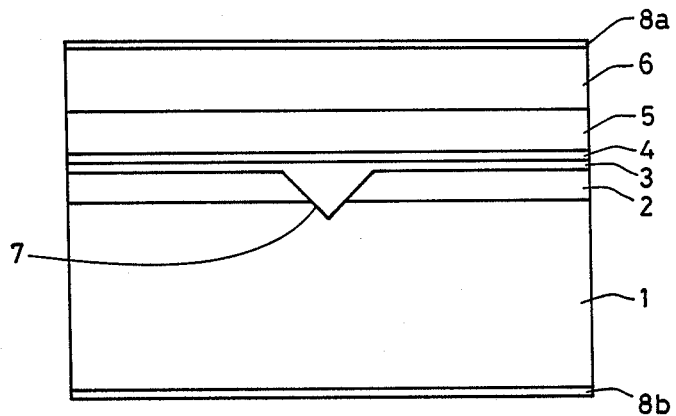
FIG. 1 is a sectional view showing a structure of a conventional semiconductor laser device having an inner stripe structure.
Figure 2:
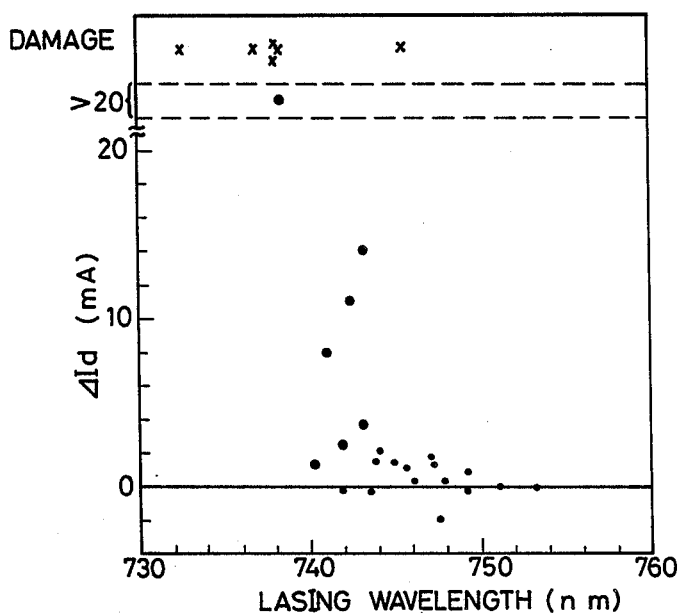
FIG. 2 is a graph showing a relation between the life characteristics of a conventional semiconductor laser device and the thickness of an active layer thereof.
Figure 3:
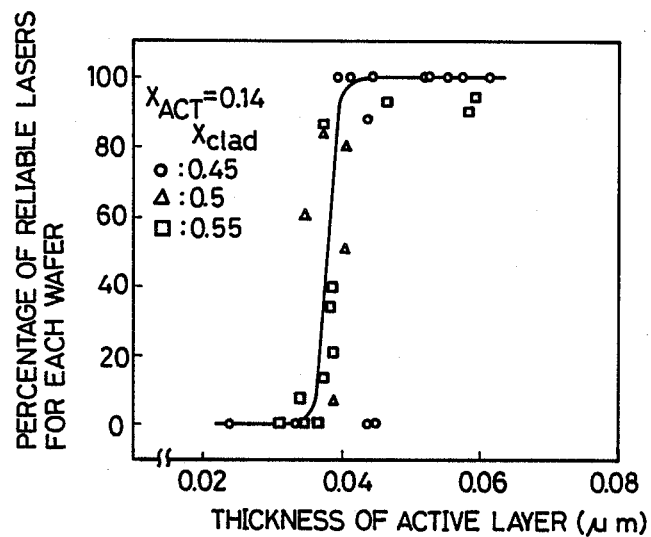
FIG. 3 is a graph showing a relation between the thickness of an active layer in a conventional channeled substrate planar semiconductor laser device and the percentage of reliable laser devices in each wafer.
Figure 4:
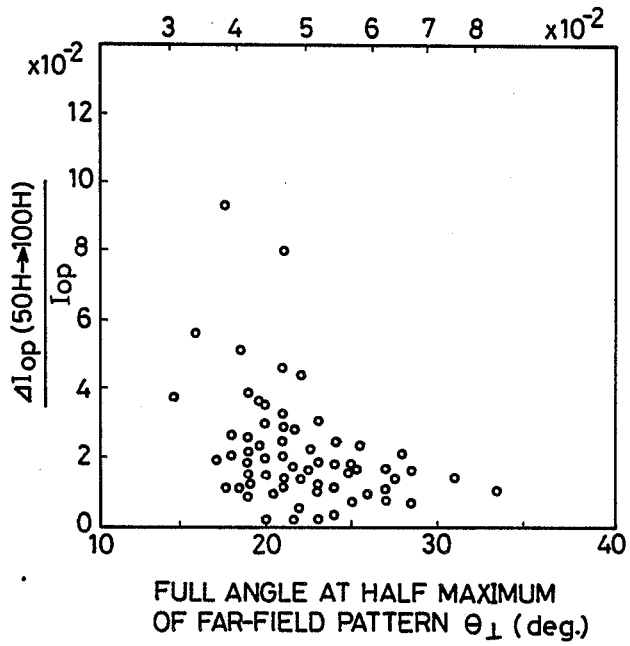
FIG. 4 is a graph showing a relation between the thickness of an active layer in a conventional twin-ridge-substrate type semiconductor laser device and the percentage of degradation of devices.
Figure 5:
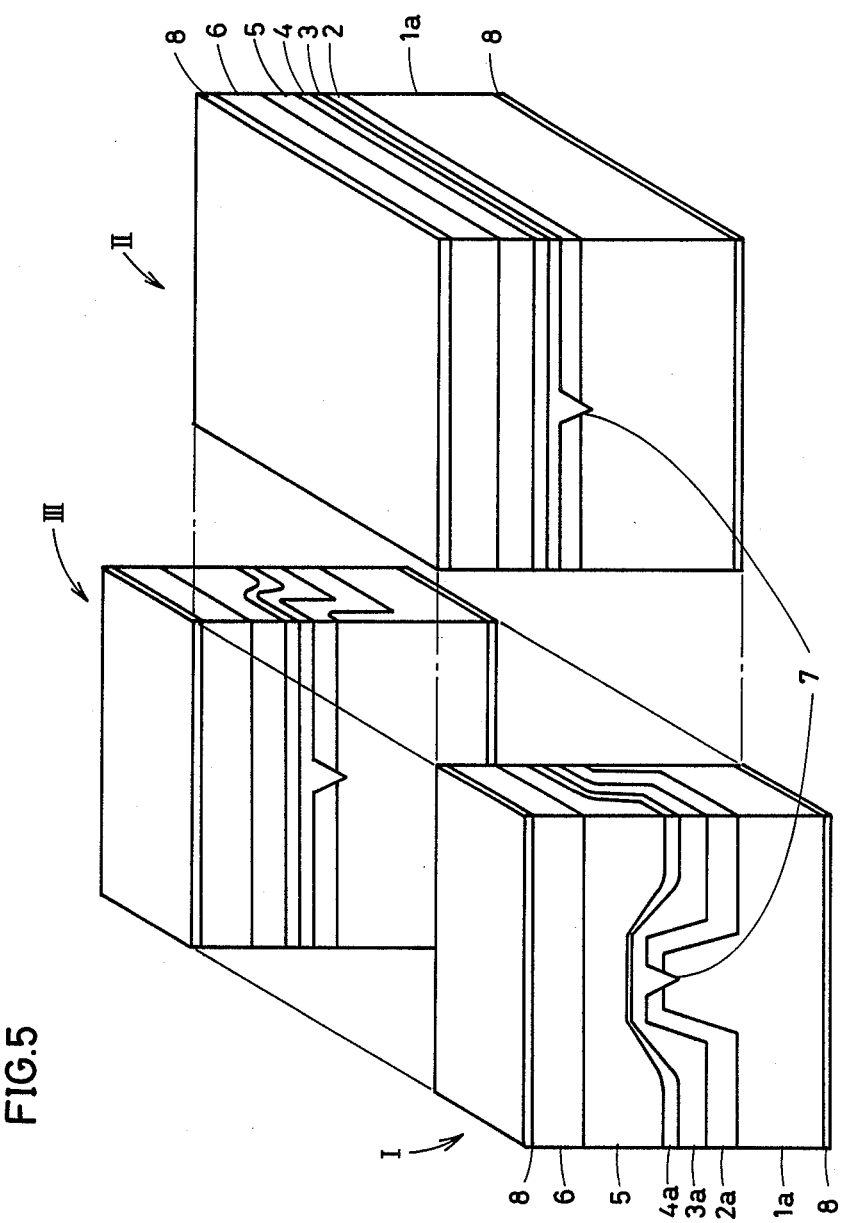
FIG. 5 is a perspective view showing an entire structure of a semiconductor laser device of an embodiment of the present invention.
Figure 6:
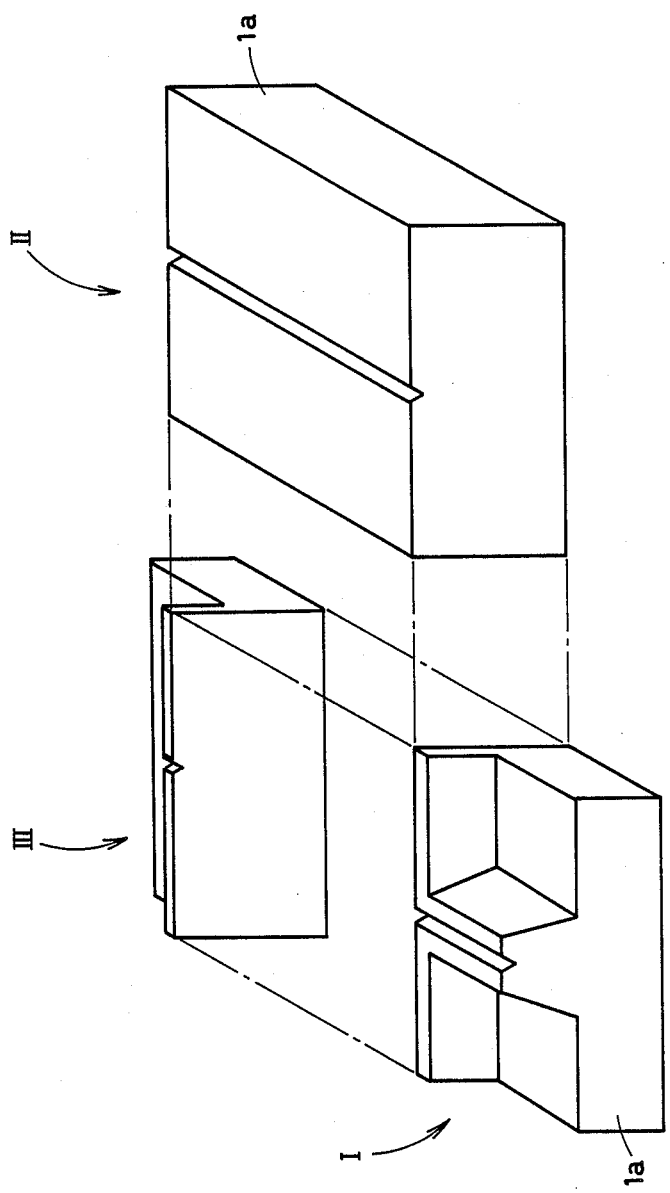
FIG. 6 is a perspective view showing a shape of a semiconductor substrate to be used in the semiconductor laser device shown in FIG. 5.

FIG. 5 is a perspective view showing an entire structure of a semiconductor laser device of an embodiment of the present invention and FIG. 6 is a perspective view showing a shape of a semiconductor substrate to be used in this embodiment of the invention. Referring to FIGS. 5 and 6, regions I and III are regions in the vicinity of the laser light emitting facets and a region II is a plane inner region. In this embodiment, the distance between the laser light emitting facets is set to 250 μm and ridge portions in the regions I and III are formed to extend with a length of 25 μm from each laser light emitting facet toward the inner region II.

In the regions I and III shown in FIG. 5, there are formed ridge portions each having elongate top portions and lowered portions as shown in FIG. 6.

On the p type GaAs substrate 1a, there are formed by epitaxial growth method, a current blocking layer 2a of n type GaAs, a lower cladding layer 3a of p type $Al_X Ga_{1-X}As$, an active layer 4a of p type $Al_Y Ga_{1-Y}As$, an upper cladding layer 5 of p type $Al_X Ga_{1-X}As$ and a contact layer of n type GaAs. In the same manner as in the above described conventional example, a V-shaped groove 7 is formed in the current blocking layer 2a so that electric current flows narrowly to stably generate a fundamental transverse mode lasing.

In the inner region II, a current blocking layer 2 of n type GaAs, a lower cladding layer 3 of p type $Al_X Ga_{1-X}As$, an active layer 4 of p type $Al_Y Ga_{1-Y}As$, an upper cladding layer 5 of p type $Al_X Ga_{1-X}As$ and a contact layer 6 of n type GaAs are epitaxially grown on the GaAs substrate 1a. In this case, the value of X is preferably 0.45 and the value of Y is preferably 0.13. This inner region II has the same structure as that of a conventional semiconductor laser device having an inner stripe structure. In addition, a V-shaped groove 7 is also formed in the current blocking layer 2.

Now, a method for manufacturing the semiconductor laser device shown in FIG. 5 will be described in the following. First, by a selective chemical etching process using photolithography, ridge-shaped portions having a level difference are formed in the regions corresponding to the regions I and III in the vicinity of the laser light emitting facets of the p type GaAs substrate 1a as shown in FIG. 6, each of the ridge-shaped portions having elongate top portions in the regions near the light emitting portion and lowered portions in the other regions. On the GaAs substrate 1a having the above described ridge-shaped portions, current blocking layers 2 and 2a of n type GaAs are epitaxially grown using a liquid phase epitaxy or a vapor phase epitaxy. Then, a V-shaped groove 7 is formed by applying again a selective chemical etching process. Subsequently, by a liquid phase epitaxy, lower cladding layers 3 and 3a, active layers 4a and 4, an upper cladding layer 5 and a contact layer 6 are epitaxially grown successively. In this epitaxial growth process, the layers in the inner region II of the substrate 1a are grown as in the prior art, while in the regions having the ridge-shaped portions in the vicinity of the laser light emitting facets, the below described phenomenon inherent to the liquid phase epitaxy occurs. Specifically stated, due to the anisotropy of a crystal face orientation, the growth rate in the lowered portions of the ridge regions becomes larger than that in a usual case and on the contrary, the growth rate in the elongate top portions of the ridge regions becomes smaller than the usual rate since it is influenced by the growth rate in the lowered portions. Accordingly, the active layer 4a grown on the top surfaces of the ridge regions in the vicinity of the light emitting portions of the laser light emitting facets has a decreased thickness compared with the active layer 4 in the regions excluding those in the vicinity of the light emitting portions of the laser light emitting facets. Thus, the thickness of the active layer 4a can be made smaller than or equal to 0.04 μm and the thickness of the active layer 4 in the inner region can be made larger than 0.04 μm.

The operation of the semiconductor laser device of this embodiment is the same as in a conventional device. It is to be noted however that the lasing characteristics are defined by emission of light caused by injection of carriers into the active layer 4 in the plane region II on the substrate 1a excluding the regions I and III in the vicinity of the laser light emitting facets. If the active layer 4 in this plane region II has a thickness of approximately 0.05 to 0.1 μm, stable lasing can be performed with the lasing threshold current being smaller than the above described value and the fundamental transverse mode being maintained.

On the other hand, since the active layer 4a formed on the elongate top portions of each ridge portion is made thinner than the active layer 4 in the inner region, the light guided on those elongate top portions of each ridge portion spreads more largely in the vertical direction of the active layer 4a, in other words, in this vertical direction, the light is infiltrated to a larger extent and the light emitting area increases. As a result, the light density at the laser light emitting facets decreases and accordingly, the COD occuring level at the laser light emitting facets is raised. Particularly, if the thickness of the active layer 4a is made smaller than 0.04 μm, the COD occuring level is improved remarkably. However, since the thickness of the whole active layer is not decreased, such unfavorable phenomenon as increase of the lasing threshold current or degradation of the life characteristics does not occur.

Although the active layers 4 and 4a in the above described embodiment were p type AlGaAs, they may be n type or undoped layers.

As the material of the active layers 4 and 4a, InGaAsP, (AlGa) InP and the like are available. As the material of the cladding layers 3 and 5, InGaP, InGaAsP, AlGaAs and the like are available. In a semiconductor laser device using any of such materials, the same effects as in the above described embodiment can be obtained.

In addition, if the thickness of the active layer becomes smaller than 200 Å, it is known that a quantum size effect which can not be seen in a bulk crystal appears. More specifically, the carriers in the active layer are confined in a potential well formed by heterojunction and the degree of freedom of the carriers in the vertical direction of the active layer is limited. As a result, quantum levels are formed in the active layer and the optical characteristics are made dependent on an electron transition among the quantum levels. An energy difference in the quantum levels becomes larger than the forbidden bandwidth of a bulk crystal as shown typically in FIG. 7.

Figure 7:
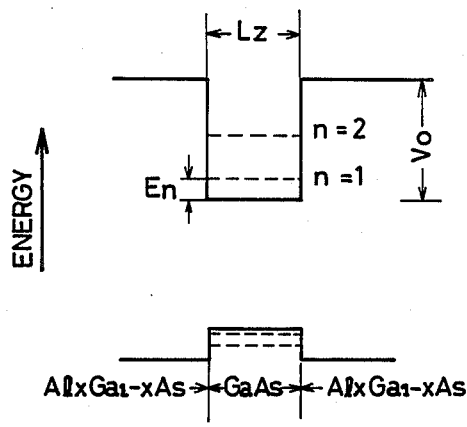
FIG. 7 is a model of energy levels when a quantum well is formed.

FIG. 7 is a diagram typically showing energy levels in case where a quantum well is formed. In FIG. 7, the solid lines represent energy levels of a bulk crystal and the broken lines represent quantum levels. $V_0$ represents the depth of a quantum well and $E_n$ represents the height of the energy of a quantum level from the bottom of the quantum well. Accordingly, if the thickness of the active layer only in the vicinity of the laser light emitting facets is decreased to serve as a quantum well, the laser light can hardly be absorbed in the laser light emitting facets. Particularly, if the energy difference in the quantum levels becomes larger than the energy of the laser light and the laser light is caused not to be absorbed in the vicinity of the light emitting facets, a so-called window structure is formed.

Figure 8:
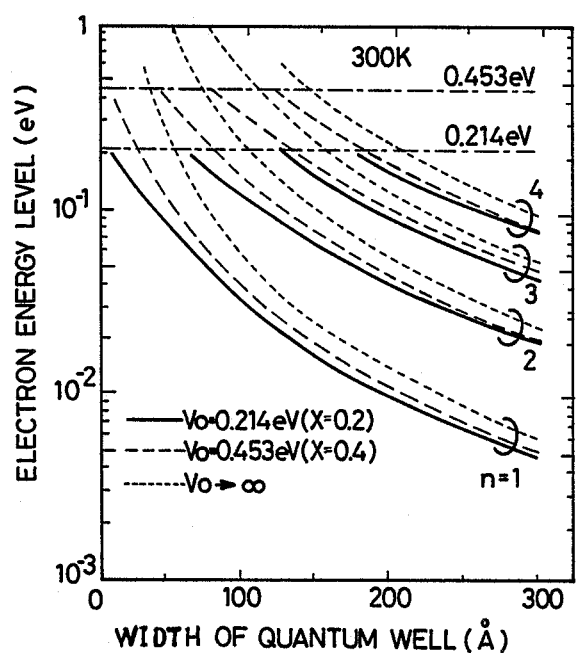
FIG. 8 is a graph schematically showing dependancy of an electron energy level on a quantum well width when a quantum well is formed.

FIG. 8 is a graph showing the result of calculation as to the relation between the width Lz of the well and a quantum level in a quantum well structure of GaAs-$Al_xGa_{1-x}As$. In FIG. 8, the horizontal axis represents the width of a quantum well, that is, the thickness of an active layer and the vertical axis represents the height of a quantum level from the bottom of the well, which corresponds to En in FIG. 7. The solid lines represent the relations in case where the depth $V_0$ of the quantum well is 0.214 eV with the X value in $Al_xGa_{1-x}As$ being 0.2; the broken lines represent the relations in case where the depth of the quantum well is 0.453 eV with the X value being 0.4; and the dotted lines represent the case where the depth $V_0$ of the quantum well is infinity. As can be seen from FIG. 8, if the depth $V_0$ of the quantum well is 0.3 eV for example, the electron energy level with the thickness of the active layer of Lz=150 Å becomes approximately 20 meV, which is a sufficient value for forming a window structure.

As described in the foregoing, according to the present invention, a semiconductor laser device is formed so that the thickness of an active layer is decreased only in the vicinity of the laser light emitting facets, and in consequence, the COD occurring level at the light emitting facets can be improved without deteriorating the operation characteristics and without lowering the reliability. Thus, a semiconductor laser device capable of stable high-output operation can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser device, having laser light emitting portions formed at laser light emitting facets, and two electrodes, comprising:
   a semiconductor substrate having a surface common with one of said electrodes;
   a lower cladding layer formed on said semiconductor substrate and having a predetermined forbidden bandwidth,
   an active layer provided directly on said lower cladding layer in contact therewith and having a forbidden bandwidth smaller than the forbidden bandwidth of said lower cladding layer, the thickness of said active layer in regions proximate the light emitting portions of said laser light emitting facets being smaller than or equal to approximately 0.04 μm and the thickness of said active layer in areas other than said regions proximate the light emitting portions of said laser light emitting facets being larger than 0.04 μm, and
   an upper cladding layer provided directly on said active layer in contact therewith and having a forbidden bandwidth larger than the forbidden bandwidth of said active layer, wherein said semiconductor substrate further includes a plane portion in said areas other than said regions proximate the laser light emitting facets and the thickness of said active layer formed on said plane portion on said semiconductor substrate is within the range of about 0.05 to 0.1 μm.

2. A semiconductor laser device in accordance with claim 1, wherein said semiconductor substrate includes ridge portions in the regions in the vicinity of said laser light emitting facets, the elongate top portions of said ridge portions serving as said light emitting portions, the height of said plane portion being substantially equal to the height of said elongate top portions.

3. A semiconductor laser device in accordance with claim 1, wherein said lower cladding layer and said active layer are epitaxially grown films formed by a liquid phase epitaxy process.

4. A semiconductor laser device in accordance with claim 1, wherein said semiconductor substrate is formed of gallium arsenide (GaAs), said active layer is formed of gallium arsenide (GaAs), and said upper cladding layer and said lower cladding layer are formed of aluminum gallium arsenide (AlGaAs).

5. A semiconductor laser device in accordance with claim 1, wherein said semiconductor substrate is formed of gallium arsenide (GaAs), said active layer is formed of aluminum gallium arsenide (AlGaAs), and said lower cladding layer and said upper cladding layer are formed of aluminum gallium arsenide (AlGaAs).

6. A semiconductor laser device in accordance with claim 1, wherein the thickness of said active layer in the regions in the vicinity of said light emitting portions of said laser light emitting facets is smaller than 200 Å.

7. A semiconductor laser device in accordance with claim 1, wherein said regions of said active layer having a thickness smaller than or equal to 0.04 μm extend with a length of approximately 25 μm from each of said laser light emitting facets toward the inner portion of said active layer.

* * * * *